United States Patent
Chen et al.

(10) Patent No.: US 7,947,131 B2
(45) Date of Patent: May 24, 2011

(54) COPPER DEPOSITION CHAMBER HAVING INTEGRATED BEVEL CLEAN WITH EDGE BEVEL REMOVAL DETECTION

(75) Inventors: Chen-An Chen, Milpitas, CA (US); Anh N. Nguyen, Milpitas, CA (US); Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/783,391

(22) Filed: May 19, 2010

(65) Prior Publication Data
US 2010/0218784 A1    Sep. 2, 2010

Related U.S. Application Data

(62) Division of application No. 11/369,590, filed on Mar. 7, 2006.

(51) Int. Cl.
*B08B 7/04* (2006.01)
(52) U.S. Cl. .......... 134/18; 134/32; 134/33; 134/34
(58) Field of Classification Search .......... 134/18, 134/113, 26, 148, 153, 147, 25.4
See application file for complete search history.

(56) References Cited

U.S. PATENT DOCUMENTS

| | | |
|---|---|---|
| 4,317,698 A | 3/1982 | Christol et al. |
| 4,767,495 A | 8/1988 | Nishioka |
| 5,608,943 A | 3/1997 | Konishi et al. |
| 6,096,233 A | 8/2000 | Taniyama et al. |
| 6,260,562 B1 | 7/2001 | Morinishi et al. |
| 6,309,981 B1 | 10/2001 | Mayer et al. |
| 6,406,641 B1 * | 6/2002 | Golzarian ............. 216/85 |
| 6,453,916 B1 | 9/2002 | Tran et al. |
| 6,494,221 B1 | 12/2002 | Sellmer et al. |
| 6,516,815 B1 | 2/2003 | Stevens et al. |
| 6,558,964 B2 * | 5/2003 | Treur ............... 438/14 |
| 6,777,338 B2 | 8/2004 | Ashjaee et al. |
| 6,786,996 B2 | 9/2004 | Emami |
| 6,833,063 B2 | 12/2004 | Basol |
| 6,951,221 B2 | 10/2005 | Okuda et al. |
| 2004/0206375 A1 | 10/2004 | Ho et al. |
| 2007/0209684 A1 | 9/2007 | Chen et al. |

FOREIGN PATENT DOCUMENTS

| | | |
|---|---|---|
| JP | 56-132326 | * 10/1981 |
| JP | 62-274738 A | 11/1987 |
| JP | 3-278854 A | 12/1991 |
| JP | 2004-179211 A | 6/2004 |
| KR | 10-2005-0060532 | 7/2005 |

OTHER PUBLICATIONS

GlobalSpec, GRIN Lenses, Jan. 8, 2003.

* cited by examiner

*Primary Examiner* — Michael Kornakov
*Assistant Examiner* — Eric Golightly
(74) *Attorney, Agent, or Firm* — Patterson & Sheridan

(57) ABSTRACT

Embodiments of the invention generally provide apparatus and method for detecting and controlling edge bevel removal of a semiconductor substrate. One embodiment of the present invention provides an apparatus for inspecting a rotating substrate. The apparatus comprises a substrate support configured to support the rotating substrate on a back side and rotate the substrate about a central axis, and a sensor positioned above the substrate support, the sensor being configured to inspect a front side of the rotating substrate while moving simultaneously radially across the substrate.

15 Claims, 11 Drawing Sheets

COPPER DEPOSITION CHAMBER HAVING INTEGRATED BEVEL CLEAN WITH EDGE BEVEL REMOVAL DETECTION

CROSS-REFERENCE TO RELATED APPLICATIONS

This application is a divisional application of co-pending U.S. patent application Ser. No. 11/369,590, filed on Mar. 7, 2006, which is incorporated herein by reference.

BACKGROUND OF THE INVENTION

1. Field of the Invention

Embodiments of the invention generally relate to an apparatus and method for processing a substrate. More particularly, the present invention relates to detecting and controlling edge bevel removal of a semiconductor substrate.

2. Description of the Related Art

In semiconductor device manufacturing, a multilayer pattern of conductive, semiconductive, and/or insulating materials is usually generated on a substrate. Multiple deposition processes, such as chemical vapor deposition (CVD), physical vapor deposition (PVD), electrochemical plating (ECP), electroless plating, and/other deposition processes, are generally conducted in a process series to generate the multiplayer pattern.

During a deposition process, a conductive material is deposited on a front surface of a substrate. However, the conductive material may also deposit on edges, and sides, i.e. bevel, of the substrate where no pattern is located. For a metal layer deposited by a PVD process, the bevel and edge region is usually thin and unevenly deposited; therefore, the metal has poor adhesion and becomes a source of particle contamination. Some materials, e.g. copper, may also migrate from the edge and bevel region to neighboring active regions, especially during an annealing step.

For a conductive layer deposited by an ECP process, an excess amount of deposition, typically referred to as an edge bead, is formed near the edge region because plating current density is higher near the edge than the remainder of the substrate surface. The edge bead is particularly undesirable. The edge bead may be pulled up and away from the edge of the substrate due to mechanical stress.

Typically, a planarization process, such as chemical mechanical polishing (CMP) or electro-chemical mechanical polishing (ECMP), is conducted after plating to remove excessive deposit and/or polish the substrate surface between individual layer deposition steps to provide a relatively flat surface for the next deposition. The edge bead is easily torn off from the substrate, damaging the adjacent portion of the substrate. The broken bead may cause further damage to the devices when it becomes loose. To control edge beads, and other unwanted deposition near the edge and bevel region, an edge bevel removal (EBR) process is generally performed after a deposition step.

An EBR process may be conducted in an EBR system which is configured to dispense an etchant on the perimeter or bevel of a substrate to remove unwanted metal deposited thereon. After an EBR process, a rinse cell is generally used to rinse the surface of the substrate (front and/or back) with a rinsing solution to remove any contaminants and/or residual chemicals therefrom. The rinse cells are generally configured to spin the substrate at a high rate of speed to spin off any remaining rinsing solution droplets adhering to the substrate surface. Once the remaining fluid droplets are spun off, the substrate is generally clean and dray, and therefore, ready for the next process, e.g. chemical mechanical polishing.

Generally, there are two primary types of EBR systems which operate to remove the over deposited conductive layers from the substrate: nozzle-type and capillary-type. A nozzle-type EBR system generally rotates a substrate below a nozzle that dispenses a metal removing solution onto the edge and possibly backside of the substrate to remove the edge bead and over-deposited metal layer. Details of an exemplary nozzle-type EBR system may be found in U.S. Pat. No. 6,516,815 granted to Joe Stevens et al, titled "Edge Bead Removal/Spin Rise Dry (EBR/SRD) Module". A capillary-type EBR system generally floats a substrate immediately above a plastic capillary ring configured to direct a metal removing solution dispensing on the back side of the substrate around the bevel area proximate the edge bead.

Although both types of EBR systems are generally effective in removing the edge bead and over deposited metal layer from the substrate, both systems suffer from inherent disadvantages: for example, the EBR systems have difficulty accurately centering substrates for processing without bowing or even breaking the substrate. Processing an off-centered substrate may cause uneven bevel edge, too thin or too wide bevel edge, incomplete removal, and decrease of valuable surface.

FIGS. 1 and 2 schematically illustrate a sectional view and a top view of a nozzle-type EBR system 100 of prior art. The EBR system 100 comprises a chamber body 101 defining a processing volume 108. A substrate support member 105 is disposed in the processing volume 108. The substrate support member 105 is configured to rotate a substrate 102 about a rotating axis 121. A lifting assembly 107 having a plurality of lifting pins 106 is disposed in the processing volume 108. The lifting assembly 107 is configured to move up and down along the rotating axis 121 so that the lifting pins 106 may pick up the substrate 102 from the substrate support member 105 or drop off the substrate 102 onto the substrate support member 105.

A fluid dispensing assembly 110 is positioned above the substrate support member 105. Referring to FIG. 2, the fluid dispensing assembly 110 comprises a dispensing nozzle 109 mounted on a pivoting arm 112 configured to move the dispensing nozzle 109 across the processing volume 108. The pivoting arm 112 may be driven by a motor 111. A fluid supply channel 113 is connected to the dispensing nozzle 109 providing a processing fluid to the substrate 102. The dispensing nozzle 109 is pointed radially outward to prevent the processing fluid from flowing towards central part of the substrate 102.

The EBR system 100 is configured to remove deposited metal from an edge region 104 of the substrate 102. During process, the substrate 102 is first positioned on the lifting pins 106 while the lifting pins 106 are on the up position and the substrate support member 105 is on the down position. The substrate 102 is then picked up by the substrate support member 105 and rotates about the rotating axis 121. A processing fluid, e.g. an etchant, is dispensed onto the substrate 102 from the dispensing nozzle 109 while the substrate 102 is rotating. The rotating movement spins the processing fluid outwards so that the deposited metal on the edge region 104 of the substrate 102 is removed and deposited metal on a surface area 103 available for patterning (hereafter available surface area 103) remains intact. The size of the edge region 104 may be adjusted by pivoting the pivoting arm 112.

Ideally, the available surface area 103 is a circle centered at the rotating axis 121 and the edge region 104 is an outer band of the substrate 102. As feature size decreases, maximization of available surface area 103 on the substrate 102 becomes important. Improper or inaccurate substrate centering can substantially limit the available surface area. Centering the substrate 102 at the rotating axis 121 and positioning the dispensing nozzle 109 in an accurate location are crucial to get an even and accurate edge region 104. However, EBR systems similar to the EBR system 100 have difficulties centering the substrate to be processed and accurately positioning the dispensing nozzle. FIG. 2 illustrates an example of an off centered edge removal result: the substrate center 122 is offset from the rotating axis 121 and the edge region 104 has a varied width around the substrate 102. As a result, some of the available surface area may be etched off and some undesired edge bead may remain even after an edge removal process. This may not only decrease the available surface area but also cause damage in latter processing steps. Additionally, misprocessing due to too small or too large an edge region may occur because of drifting in the position of the dispensing nozzle. Furthermore, contaminations or incomplete removal may result particle 120 in the edge region 104 after the edge bevel removal process. The offset, variation of nozzle location, and particles may be detected by running an inspection a separated inspection station. However, separated inspection decreases system efficiency and increases cost of ownership.

Therefore, there exists a need for an apparatus and method for detecting substrate conditions during an edge bevel removing process.

SUMMARY OF THE INVENTION

Embodiments of the invention generally provide apparatus and method for detecting and controlling edge bevel removal of a semiconductor substrate.

One embodiment of the present invention provides an apparatus for inspecting a rotating substrate. The apparatus comprises a substrate support configured to support the rotating substrate on a back side and rotate the substrate about a central axis, and a sensor positioned above the substrate support, the sensor being configured to inspect a front side of the rotating substrate while moving simultaneously radially across the substrate.

Another embodiment of the present invention provides an apparatus for processing a bevel edge of a rotating substrate. The apparatus comprises a chamber body defining a processing volume, a rotatable substrate support member positioned in the processing volume and configured to support the rotating substrate on a backside, a pivoting arm positioned above the rotatable substrate support member and connected to the chamber body, a fluid dispensing nozzle mounted on the pivoting arm for dispensing a processing fluid a front side of the rotating substrate, and a sensor mounted on the pivoting arm configured to inspect the front side of the rotating substrate simultaneously with processing the rotating substrate.

Yet another embodiment of the present invention provides a method for inspecting a substrate. The method comprises providing a rotatable substrate support member, providing a sensor pivotably positioned above the substrate support member, positioning the substrate on the substrate support member, and inspecting a front side of the substrate in a spiral motion by pivoting the sensor while rotating the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide an edge bevel removal system capable of monitoring substrates being processed in real-time. The invention is illustratively described below in reference to modification of a SlimCell™ system, available from Applied Materials, Inc., Santa Clara, Calif.

Figure 1:
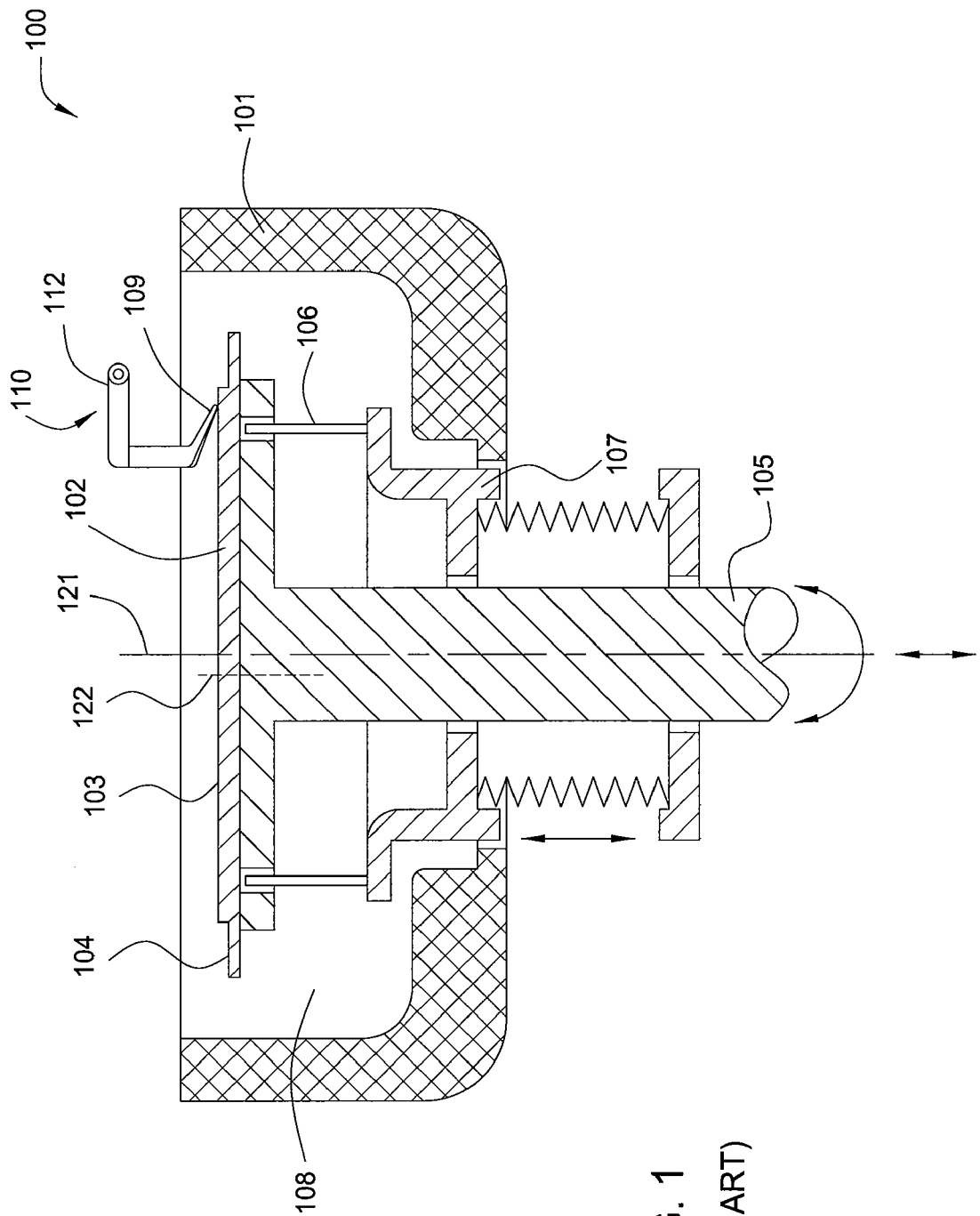
FIG. 1 illustrates a schematic sectional view of an edge bevel removal system of prior art.
Figure 2:
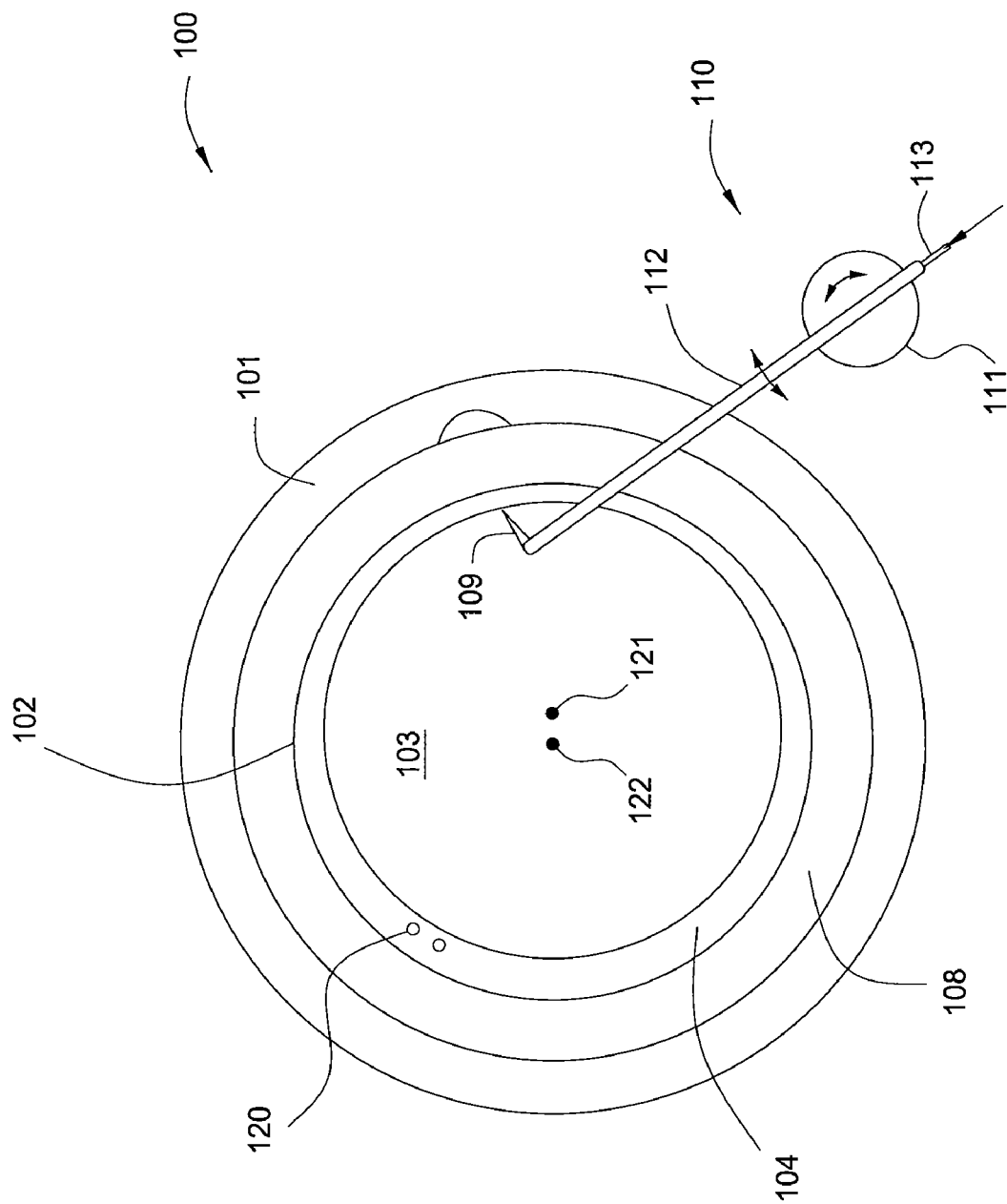
FIG. 2 illustrates a schematic top view of the edge bevel removal system of FIG. 1.
Figure 3:
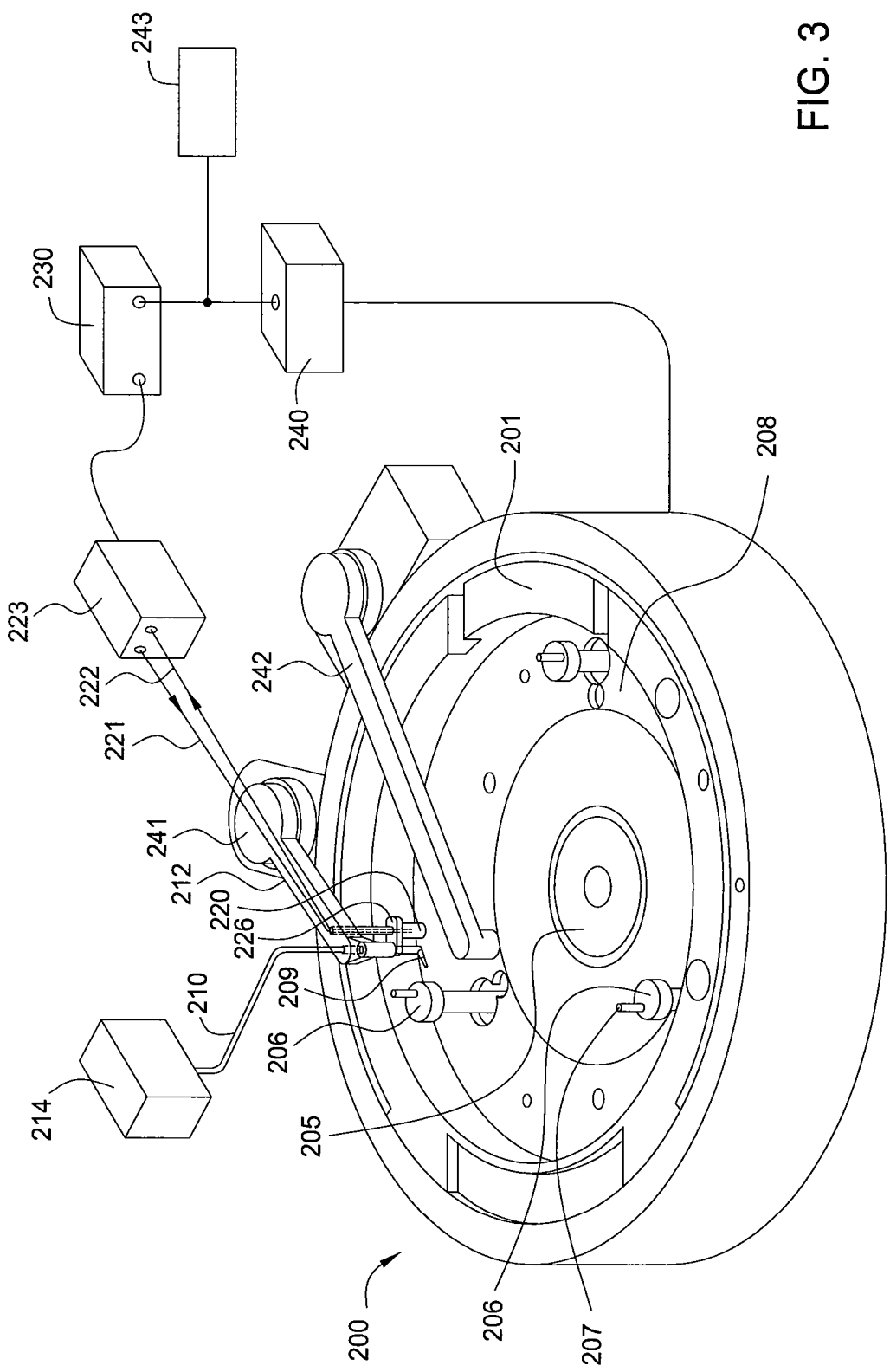
FIG. 3 illustrates a schematic perspective view of one embodiment of an edge bevel removal system of the present invention.

FIG. 3 illustrates an exemplary edge bevel removal system 200 of the present invention. The edge bevel removal system 200 comprises a basin 201 defining a processing volume 208. A substrate chuck 205 is disposed in a central portion of the processing volume 208. The substrate chuck 205 is configured to be rotatable and/or vertically actuatable. In one embodiment, the substrate chuck 205 may be a vacuum chuck having an aperture selectively in fluid communication with a vacuum source.

The edge bevel removal system 200 may further comprises a substrate centering mechanism configured to adjust a substrate to be processed so that the substrate is substantially centered at a rotating axis of the substrate chuck 205. In one embodiment, the edge bevel removal system 200 comprises three rotatable centering members 206 configured to receive and center the substrate to be processed. The centering members 206 extend upwardly from the bottom of the basin 201 and are positioned radially outward of the substrate chuck 205 in an equal spacing arrangement. A centering pin 207 extending from an off centered position of each centering members 206 is configured to engage the substrate by the edge. When the centering members 206 rotate inwardly, the centering pins 207 move toward the substrate chuck 205 pushing and holding the substrate in a centered position. A detailed description of an exemplary centering assembly may be found in paragraphs 0037-0041 and FIGS. 6, 7A and 7B of U.S. patent application Ser. No. 10/826,492, titled "Integrated Bevel Clean Chamber", filed on Apr. 16, 2004, which is herein incorporated by reference.

The edge bevel removal system 200 further comprises a chemical arm 212 and a rinsing arm 242. Both arms 212 and 242 are pivotally mounted to a perimeter portion of the edge bevel removal system 200, and include a longitudinally extending arm configured to support at least one fluid dispensing nozzle positioned on a distal end thereof. The chemical arm 212 is configured to facilitate dispensing a processing solution precisely to a radial position of the substrate being processed. The rinsing arm 242 is configured to facilitate dispensing of a rinsing solution onto the substrate. The operation of arms 212 and 242 may be controlled by two separate motorized actuator assemblies, which are configured to precisely position the distal end of the respective arm 212 or 242 over a specified radial position of the substrate being processed via pivotal actuation and/or vertical actuation. In one embodiment, the chemical arm 212 and the rinsing arm 242 may be pivoted by servo motors. A chemical nozzle 209 is mounted on a distal end of the chemical arm 212. In one embodiment, the chemical nozzle 209 is radially pointing outward to prevent the processing solution from flowing towards central part of the substrate. The chemical nozzle 209 is configured to supply the processing solution from a processing solution reservoir 214 via a solution supply channel 210.

A sensor 220 configured to detect surface conditions of the substrate being processed is mounted on the distal end of the chemical arm 212, which is configured to precisely position the chemical nozzle 209. The sensor 220 is configured to survey the upper surface of the substrate being processed via a pivoting movement carried out by the chemical arm 212 and the rotating movement of the substrate driven by the substrate chuck 205. Mounting the sensor 220 on the chemical arm 212 is economical because the sensor 220 and the chemical nozzle 209 share one high precision positioning mechanism of the chemical arm 212, and no extra movement is required. Additionally, mounting the sensor 220 and the chemical nozzle 209 together also enables simultaneous edge removal and detecting without affecting throughput of the edge bevel removal system 200. The detecting process can be performed when the chemical arm 212 is moving out at a constant speed after finishing the edge removing process.

In one embodiment, the sensor 220 is an optical sensor which projects a light beam to the upper surface of the substrate and measures the light beam reflected by the upper surface of the substrate. Because different surfaces are different in reflectivity, characteristics of the reflected light beam, such as intensity, can be used to determine the nature of the reflecting surface. For example, a surface of plated copper has a higher reflectivity than a surface of a semiconductor substrate without plated copper, such as an edge area after plated copper has been removed, and the edge area therefore has a higher reflectivity than areas outside the substrate. The reflected light from plated copper surface has a higher intensity than that from an edge area. Therefore, the sensor 220 configured to measure a reflected light beam from a point of a surface can be used to determine if the point being measured is within a plated surface, an edge removal area or outside the substrate.

The sensor 220 is further connected to a detection box 223 via an input cable 221 and an output cable 222. If the sensor 220 is an optical sensor, the detection box 223 may comprise a light source connected to the input cable 221, a light receiver connected to the output cable 222, and an amplifier circuit. The configuration of the detection box 223 will be described in detail in FIG. 5A. The detection box 223 outputs an electrical signal to a data acquisition box 230 which processes the electrical signal and analyzes surface conditions of the substrate being measured. The data acquisition box 230 may be further connected to the system controller 240 so that the arms 212/242 and the centering members 206 may be calibrated and adjusted according to the measuring results from the sensor 220. In one embodiment, the data acquisition box 230 may be further connected to a system controller 243 to adjust or calibrate robots that transport substrates in and out the edge bevel removal system 200.

In one aspect, the data acquisition box 230 may include a programming logic controller (PLC). In one aspect, the data acquisition box 230 may take analog signal from the detection box 223 and convert the analog signals to edge bevel removal (EBR) width information, which will be fed into the system controller 240 in the form of 0-5 volt output. The output is linearly proportional to the EBR width. In another aspect, the data acquisition box 230 may provide EBR width and non-concentricity information via RS232 or Ethernet to the system controller 240 or other related controllers. The data acquisition box 230 may further incorporate a hardware or software noise filter to minimize or eliminate possible noise in the incoming singals. In another embodiment, the data acquisition box 230 may have a have a serial port (USB) to for displaying raw data for diagnostic proposes.

Figure 4:
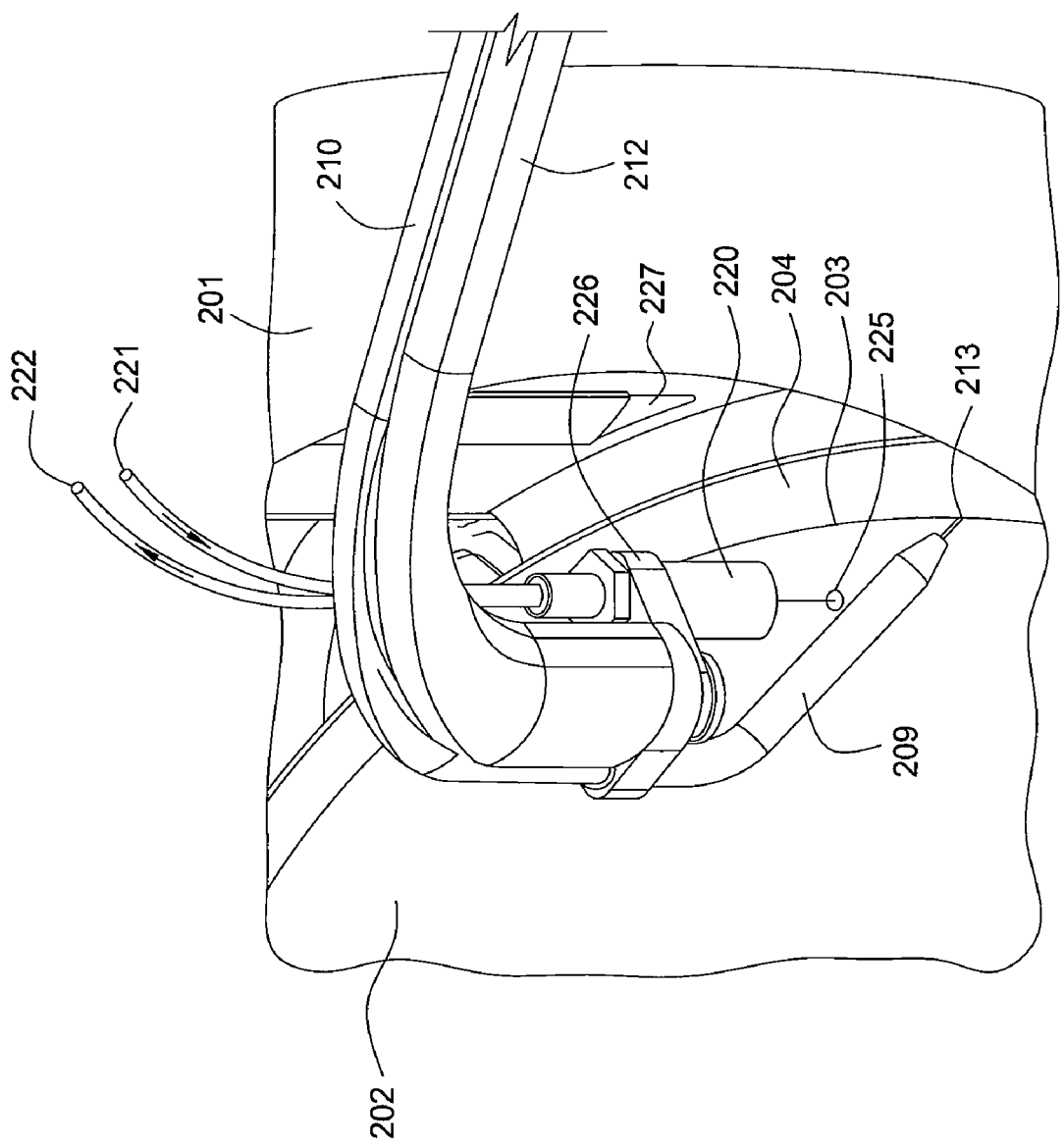
FIG. 4 is an enlarged view of the edge bevel removal system of FIG. 3.

FIG. 4 illustrates an enlarged view of the edge bevel detecting sensor 220 of FIG. 3. A substrate 202 having an edge bevel area 204 is disposed in the substrate chuck 205 (shown in FIG. 3). A circle 203 indicates a boundary between the edge bevel area 204 and a central region of the substrate 202. In one embodiment, the sensor 220 is bound to an end of the chemical arm 212 by a bracket 226 made of materials with chemical resistance, for example a VICTRES® PEEK™ polymer. In one aspect, the nozzle 209 and the sensor 220 are positioned such that a pinpoint spot 225 inspected by the sensor 220 is radially inside a point 213 sprayed by the chemical nozzle 209. Thus, during process, when the chemical arm 212 moves the chemical nozzle 209 from radially outward to remove the bevel area 204, the sensor 220 simultaneously inspects areas already processed. Resolution of measurement from the sensor 220 may be adjusted by varying the rotating rate of the substrate, the speed of the chemical nozzle 209, and the size of the pinpoint spot. A detailed description will be given in FIGS. 6 and 7. A pocket 227 may be formed on an inner side of the basin 201 to accommodate the sensor 220 and/or the nozzle 209 when the chemical arm 212 moves outside the substrate 202.

Figure 5A:
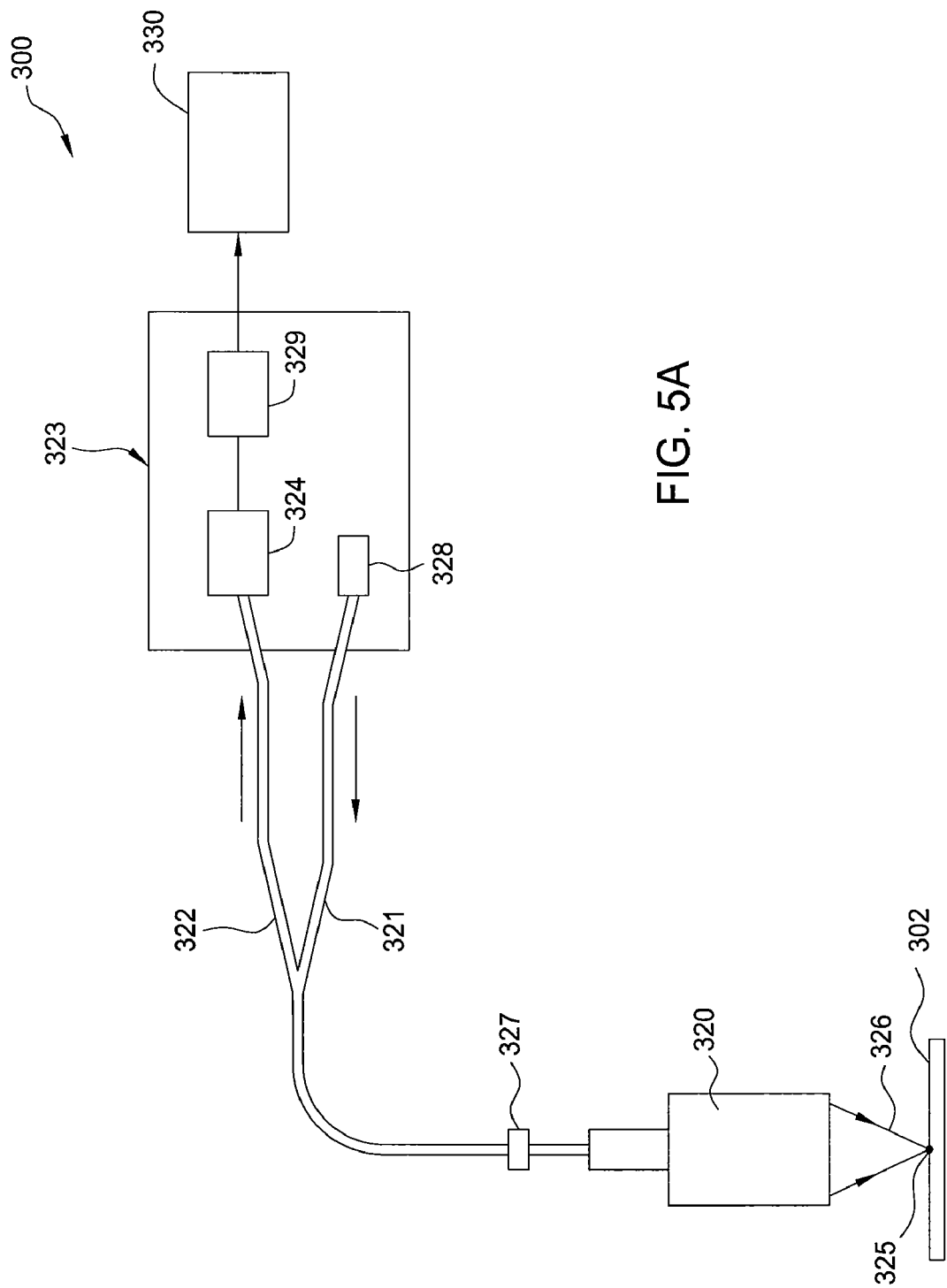
FIG. 5A illustrates a schematic view of one embodiment of an edge bevel detecting system in accordance with this invention.

FIG. 5A illustrates a schematic view of an exemplary optical sensor system 300, which may be used in the edge bevel removal system 200 of FIG. 3. It should be noted that the optical sensor system 300 may be used independently in an inspection station, or any processing chamber that requires precise positioning of substrate being processed.

The optical sensor system 300 comprises a light emission source 328 configured to emit an electromagnetic radiation. In one embodiment, the light emission source 328 emits a broad spectrum of radiation across the range of wavelengths from about 200 nm to about 1100 nm. Examples of possible electromagnetic radiation sources might be a tungsten filament lamp, a laser (e.g., yttrium aluminum garnet (YAG), excimer, etc), a laser diode, a xenon lamp, a mercury arc lamp, a metal halide lamp, a carbon arc lamp, a neon lamp, a sulfur lamp, or a combination thereof.

The light emission source 328 is connected to an optic assembly 320 via an input cable 321. In one aspect, the input cable 321 is an optic fiber wrapped in a coaxial cable sheath made of polyolefin. The electromagnetic radiation emitted by the light emission source 328 travels through the input cable 321 to the optic assembly 320. The optic assembly 320 is configured to collimate, focus, and/or direct the electromagnetic radiation from the light emission source 328 and project a signal beam 326 to a processing surface 302 at a pinpoint spot 325.

After hitting the processing surface 302, the signal beam 326 is reflected by the processing surface 302 back to the optic assembly 320. A detector 324 is connected to an output cable 322. In one embodiment, the detector 324 is configured to measure the intensity of electromagnetic radiation across one or more wavelengths of the reflected signal beam 326. The detector 324 may be selected from the following classes of sensors, for example, a photovoltaic, a photoconductive, a photoconductive-junction, a photoemissive diode, a photomultiplier tube, a thermopile, a bolometer, a pyroelectric sensor or other like detectors.

The detector 324 converts the reflected signal beam to an electrical signal which is then transferred to an amplifier assembly 329. The amplifier assembly 329 amplifies the electrical signal from the sensor to a level recognizable by a data processing unit 330 connected thereon. In one embodiment, the amplifier assembly 329 is an analogy amplifier for high precision without introducing A/D error.

Figure 5B:
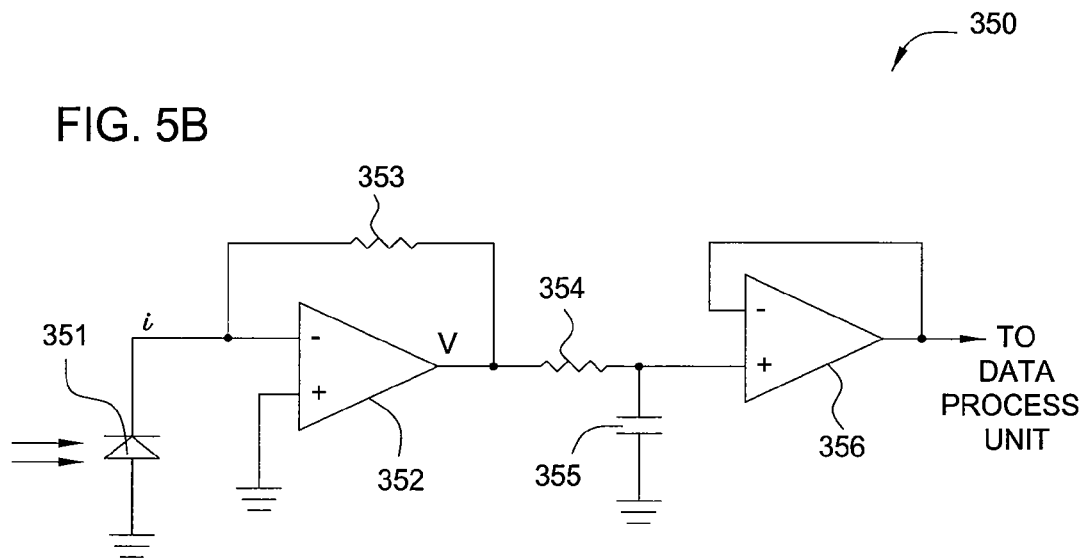
FIG. 5B illustrates a schematic view of one embodiment of a circuit for processing sensor signals in accordance with this invention.

In one embodiment, a filter may be used to dim noises in the electrical signal from the sensor. FIG. 5B schematically illustrates an exemplary amplifier assembly 350 in accordance with the present invention. A diode 351 represents an optical circuit, such as circuit of the detector 324. The diode 351 generally produces a current that is proportional to the intensity of received signal beam. The diode 351 is electrically connected to a terminal of an amplifier 352 which converts the current from the diode 351 to a voltage with a gain. The amplitude of the gain may be decided by a resister 353 coupled to the amplifier 352. In one aspect, the amplifier 352 is coupled to a low-pass filter having a resister 354 and a capacitor 355. A voltage follower amplifier 356 may be further connected to the resister 354 and capacitor 355 for buffering the voltage output.

Figure 5C:
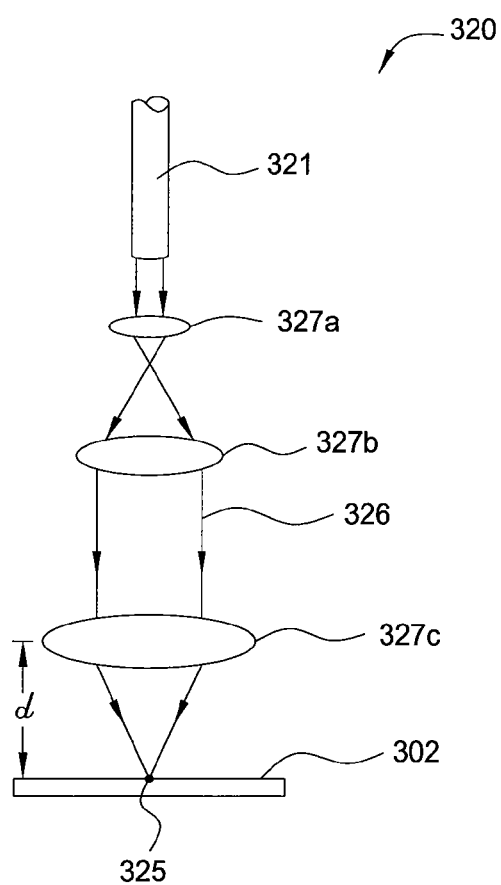
FIG. 5C illustrates a schematic view of one embodiment of optics in accordance with the present invention.

FIG. 5C illustrates one embodiment of the optic assembly 320 of the present invention. The optic assembly 320 comprises three lenses 327a, 327b and 327c. The input cable 321 emits the signal beam 326 to the lenses 327a and 327b wherein the signal beam 326 is expanded and/or collimated. The lens 327c then projects the expanded signal beam 326 to the processing surface 302 on the pinpoint spot 325. In one embodiment, the lenses 327a, 327b and 327c are acrylic lenses. In one configuration, the lenses 327a, 327b and 327c may have diameter of about 3 millimeter and the distance d between the lens 327c to the processing surface 302 is about 7.5 millimeter. In another embodiment, the lenses 327a, 327b and 327c are gradient index lenses (GRIN). The size of the pinpoint spot 325 may be adjusted by changing the distance d.

An edge bevel processing system of the present invention, for example the edge bevel removal system 200 of FIG. 3, may perform edge bevel removal and inspecting the edge bevel simultaneously. During process, a substrate is centered in a substrate support member and spun by the substrate support member. A chemical arm carrying a fluid dispensing nozzle and a sensor moves outwardly across the substrate. In one embodiment, the fluid dispensing nozzle and the sensor are positioned such that the fluid dispensing nozzle focuses at a point radially outward in respect to a focus point of the sensor. When the focus point of the fluid dispensing nozzle reaches an inner edge of an edge bevel area, a processing fluid is dispensed onto the substrate. During processing, the chemical arm is stationary and moves outward when the process is complete. As the chemical arm moves outward, the focus point of the sensor reaches the bevel area and the bevel area may be measured. Signals from the sensor may be sampled and processed so that characteristics of the bevel edge become known as soon as the edge bevel process is finished.

Figure 6:
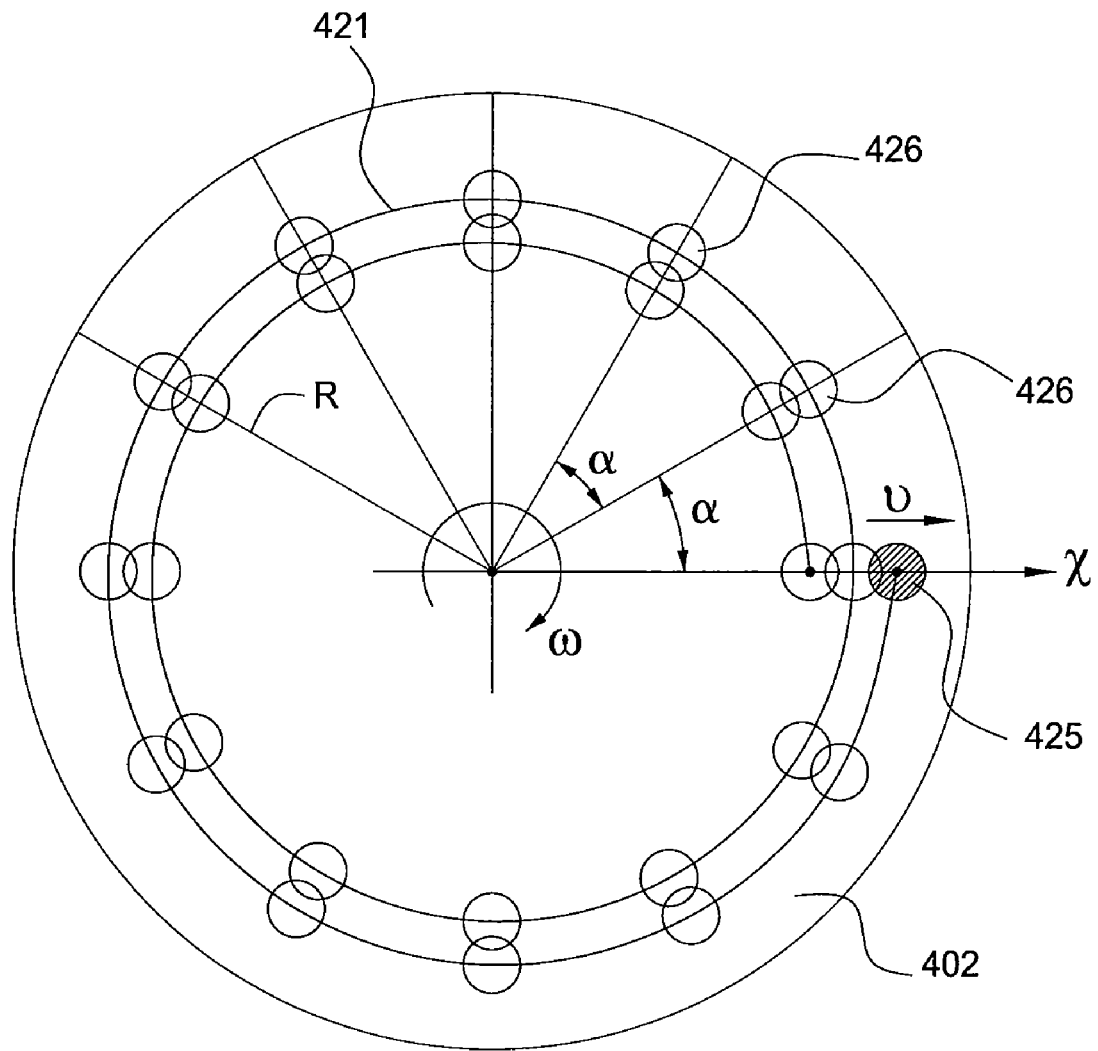
FIG. 6 illustrates an exemplary inspecting sequence in accordance with the present invention.

FIG. 6 illustrates an exemplary inspecting process. A substrate 402 rotates at a speed ω. A sensor (not shown) moves at speed v along axis x thus the pinpoint spot 425 of the sensor also moves at speed v along axis x. It should be noted that the sensor actually moves in a pivoting motion. The movement of the sensor may be considered linear near the edge bevel area because the pivoting radius of the sensor is relative large compared to the width of a bevel edge, which is generally less than about 5 millimeter. The measurement inaccuracy due to the a slight nonlinearity of the arm movement can be corrected by incorporating a correction factor in final data processing.

A spiral curve 421 illustrates the trajectory of the pinpoint spot 425 on the substrate due to the linear movement of the sensor and the spinning movement of the substrate. In one embodiment, both the rotating speed ω and the linear speed v are constant. The sensor signal may be sampled at a period dt. Spots 426 represents locations on the substrate 402 where the sensor signal are sampled. Spots 426 sampled immediately next to each other have an angle of α ($\alpha=\omega*dt$). Adjusting dt and ω appropriately, the spots 426 may distribute in groups along a plurality of radii R that are α degrees away from one another. In one aspect, properties of the substrate 402 along a radius may be measured by analyzing sensor signals from spots 426 along the radius. The properties may include width of edge bevel area along the radius, surface conditions along the radius, and contaminations. In one embodiment, the spot 426 may overlap with its immediate neighboring spot 426 along the same radius for a precise measurement. In one aspect, the spots 426 may be circles having a diameter of about 0.15 mm and neighboring spots 426 may overlap by about 0.05 mm along the diameter, which is about 30%. The overlapping may be realized by adjusting linear speed v, and/or spot size, and/or rotation speed ω.

Figure 7:
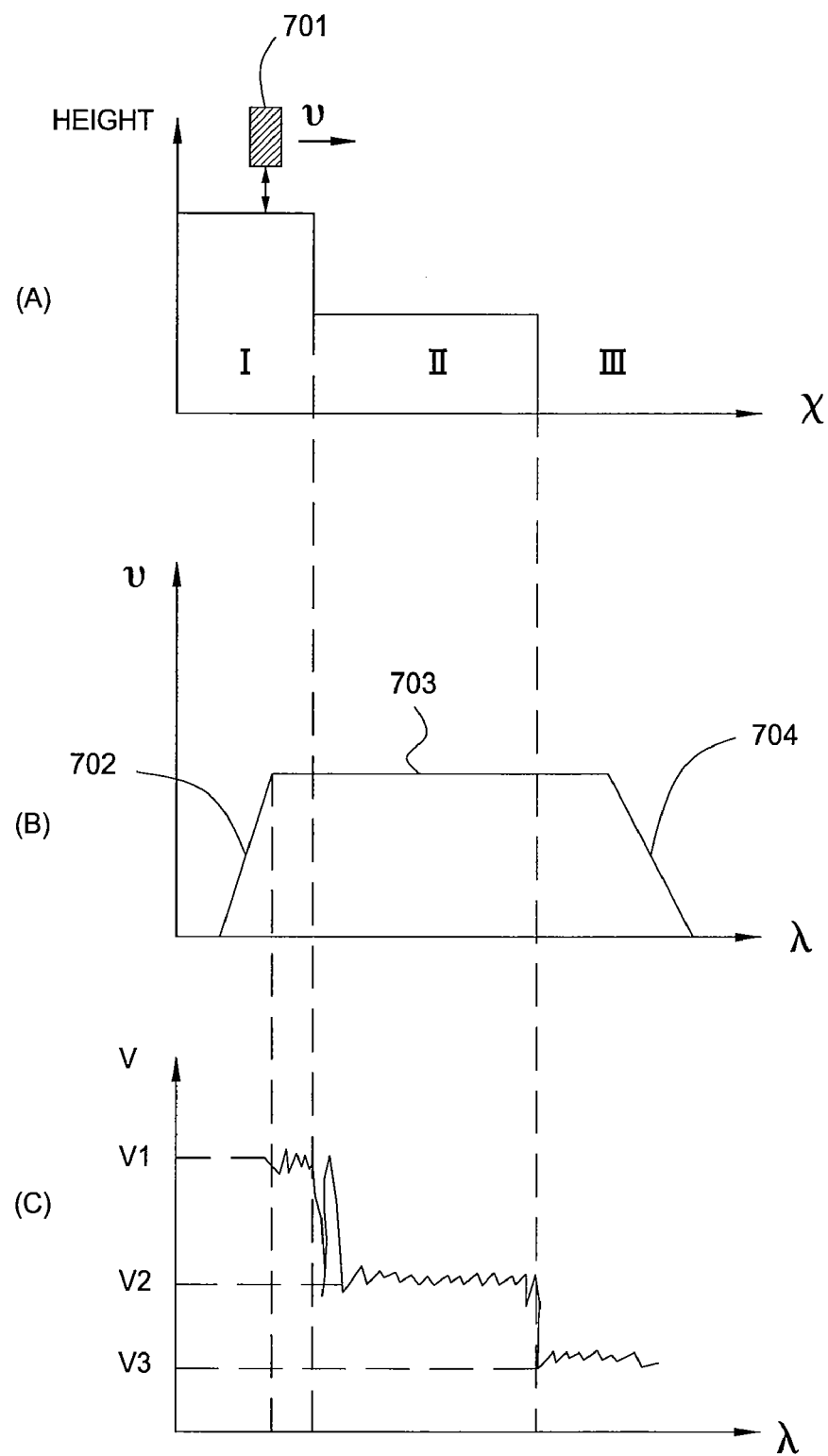
FIG. 7 illustrates an exemplary edge bevel and inspection result in accordance with the present invention.

FIG. 7 illustrates an exemplary edge bevel and inspection result along one radius. The horizontal axes in charts (a), (b) and (c) illustrate distance from center of the substrate. Chart (a) of FIG. 7 illustrates a sectional view of a substrate along one radius. The vertical axis of chart (a) illustrates the height of the substrate. Region I represents the center area of the substrate. Region II represents the edge bevel area where a layer of material has been removed. Region III represents outside the substrate. During an inspecting process, a sensor 701 positioned above the substrate moving from above Region I to above Region III at speed v, projecting a signal beam to the substrate surface and sensing a reflected signal beam. Chart (b) of FIG. 7 illustrates the speed v of the sensor 701 from Region I to Region III. Chart (b) shows that the sensor 701 rapidly accelerates along line 702 to a constant speed shown in line 703 within Region I. The sensor 701 passes the rest of the Region I, Region II and part of Region III at the constant speed, then stops in Region III. Chart (c) illustrates a measuring result along one radius of the substrate. Due to difference in reflectivity of Regions I, II and III, the measured signal values from Regions I, II and III are V1, V2 and V3 respectively. Thus, width of the bevel edge, Region II, may be determined from measured signal values from chart (c).

Figure 8:
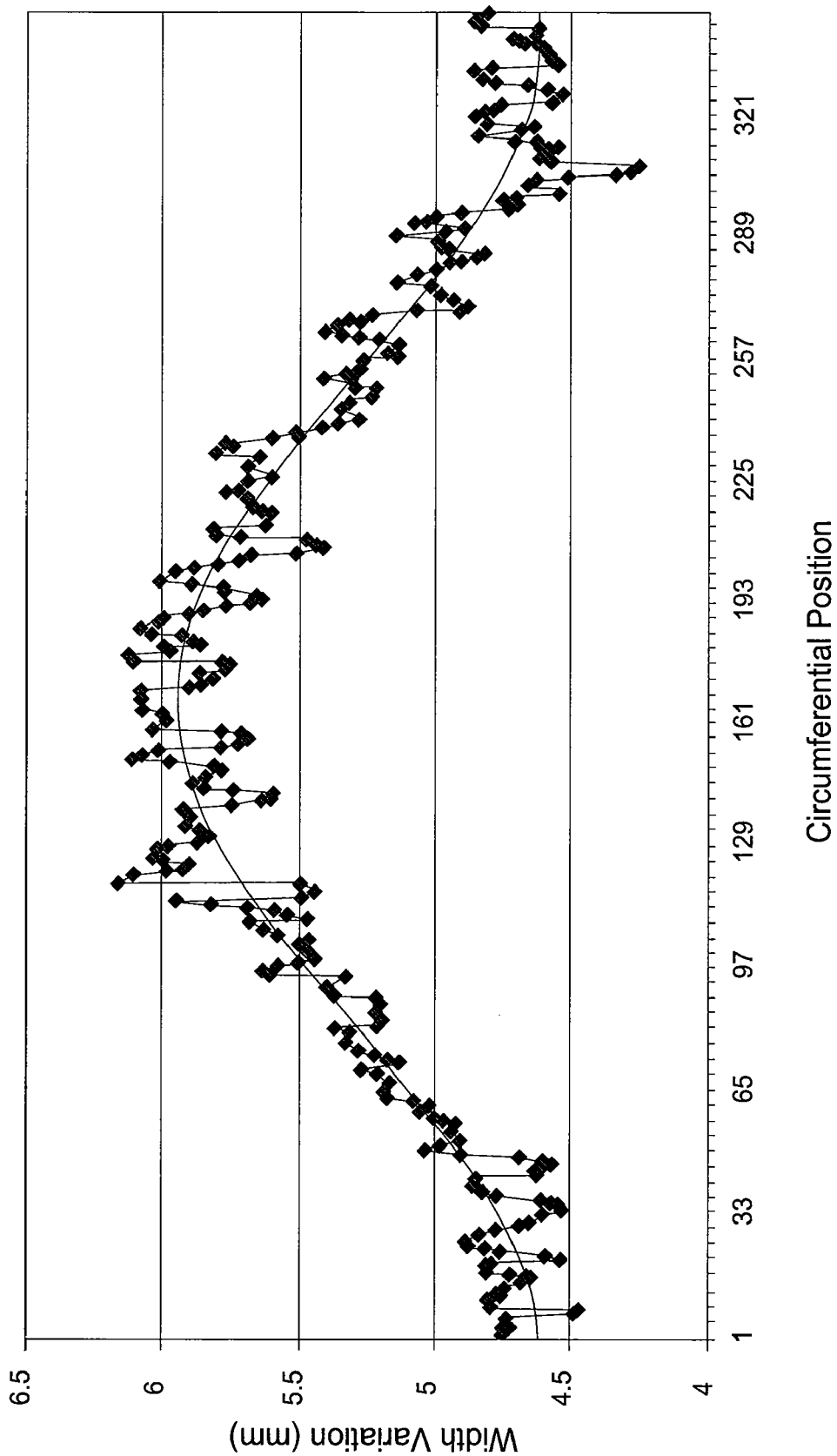
FIG. 8 illustrates an exemplary edge bevel detection result in accordance with the present invention.

FIG. 8 illustrates an exemplary edge bevel detection result along a circumference of a substrate. The horizontal axis represents circumferential positions of a substrate. The vertical axis represents width of the bevel edge of the substrate. The exemplary result in FIG. 8 shows a varied width of the bevel edge along the circumference of the substrate. The degree of width variation may be measured with eccentricity, which may be related to a measured width in the following form:

$$w_{measured}(x) = E\sin(x+\theta) + w_{average} \quad \text{(Equation 1)}$$

where x denotes a circumferential position, $w_{measured}$ denotes measured width, $w_{average}$ is average value of all the measured width, $\theta$ is a phase shift, and E is the amplitude of the eccentricity. In one aspect, after a substrate is measured, the measured width $w_{measured}$ for every circumferential position may be calculated from the measurement. The average width $w_{average}$ can then be easily calculated from the measured width $w_{measured}$. Then amplitude of eccentricity E may be calculated by fitting $w_{average}$ and $w_{measured}$ into Equation 1.

Figure 9A:
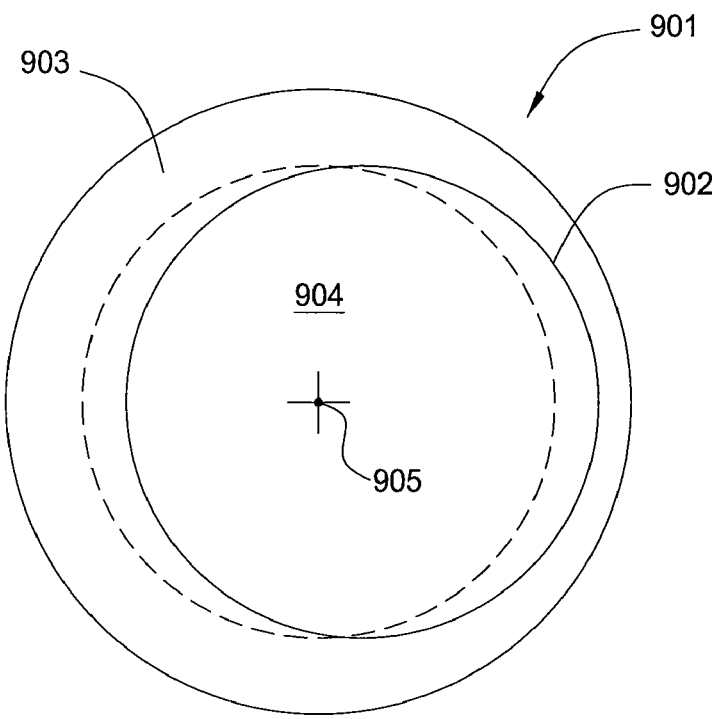
FIG. 9A illustrates a substrate with an eccentric edge bevel in accordance with the present invention.
Figure 9B:
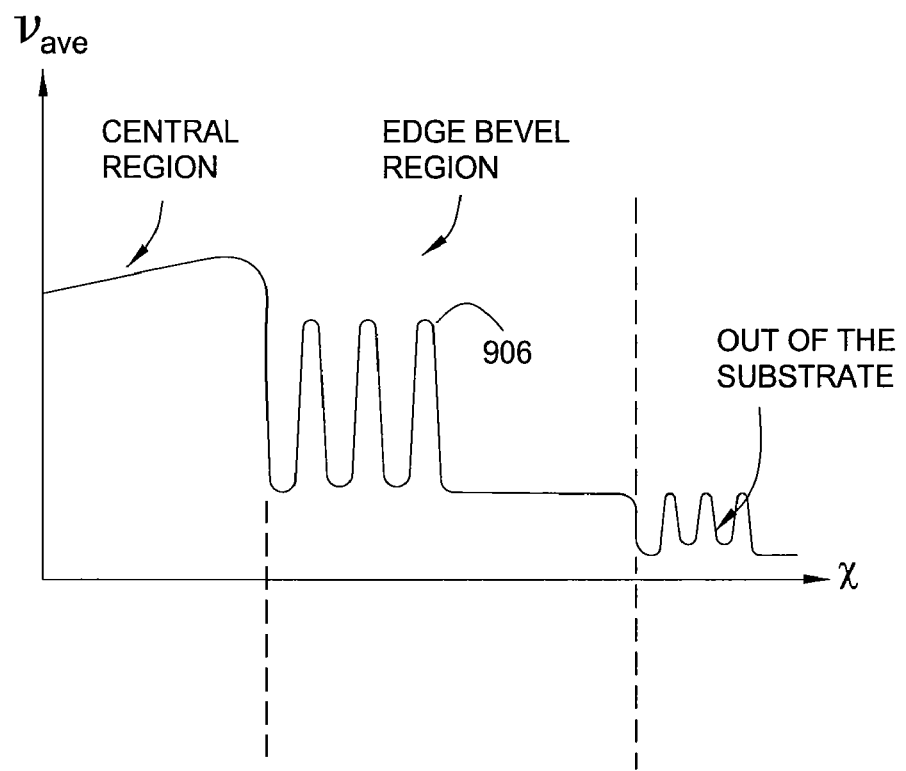
FIG. 9B illustrates an exemplary inspecting result of the substrate of FIG. 9A in accordance with the present invention.

FIG. 9A illustrates a substrate 901 having an eccentric edge bevel region 903 in respect to a center point 905 of the substrate 901. Curve 902 is the boundary between a central region 904 and the edge bevel region 903. In one embodiment, the eccentricity of edge bevel region 903 may be detected by averaging measurements of all the circumferential positions. FIG. 9B illustrates an exemplary inspecting result of the substrate of FIG. 9A. The horizontal axis of FIG. 9B illustrates a distance to the center point 905 of the substrate 901 and the vertical axis indicates average measured signal values. FIG. 9B is similar to chart (c) of FIG. 7, only with averaged values. A peak 906 in the edge bevel region indicates an eccentricity of the bevel edge region.

Figure 10A:
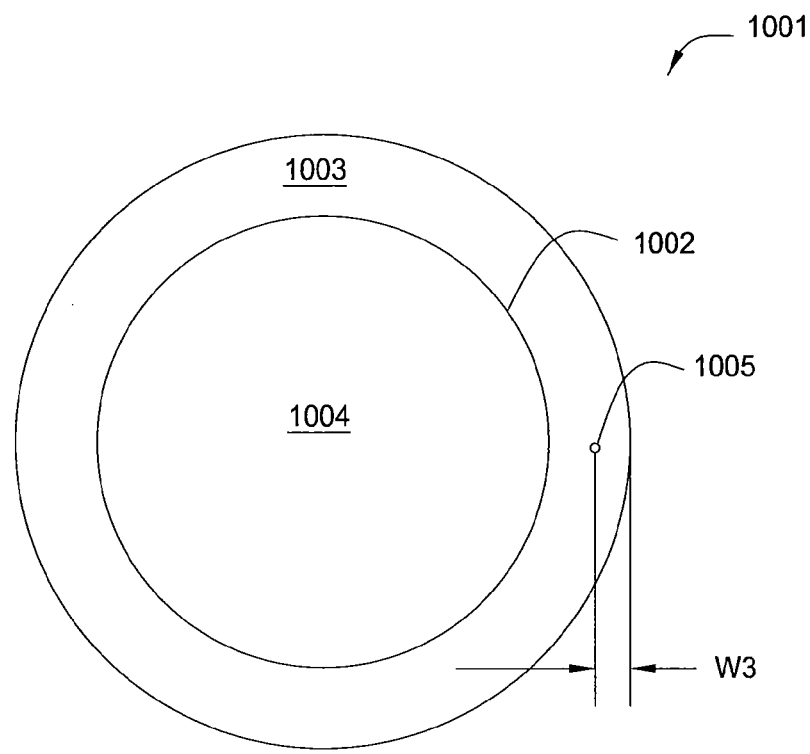
FIG. 10A illustrates a substrate having a particle contamination in the bevel edge area in accordance with the present invention.
Figure 10B:
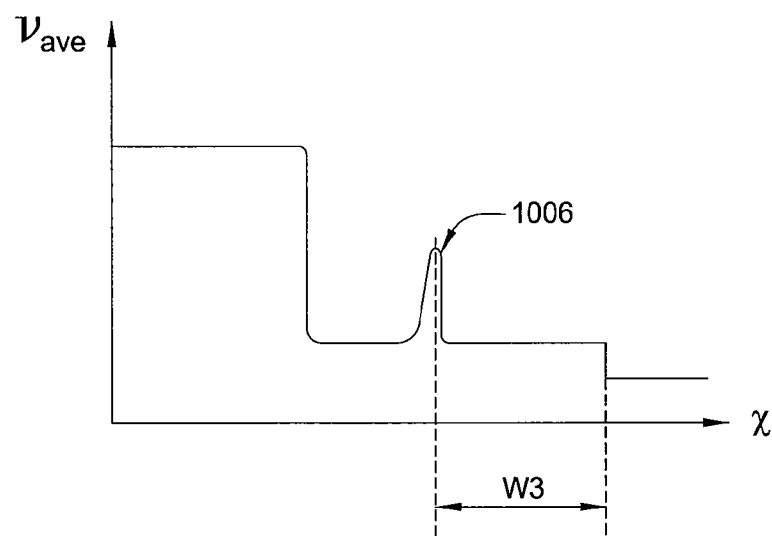
FIG. 10B illustrates an exemplary inspecting result of the substrate of FIG. 10A in accordance with the present invention.

FIGS. 10A-B illustrates another exemplary substrate 1001 and its measurement. The substrate 1001 has a bevel edge region 1003 and a central region 1004. Curve 1002 indicates the boundary between the bevel edge region 1003 and the central region 1004. A contamination 1005, such as a metal spot due to an incomplete bevel edge removal, is located in the bevel edge region 1003. The distance between the contamination 1005 and an edge of the substrate 1001 is w3. Similar to FIG. 9B, FIG. 10B illustrates an average measurement along all the circumferential positions. A small peak 1006 indicates the existence and the distance of the contamination 1005 front the edge of the substrate 1001.

As discussed, the apparatus and method of the present invention provide build-in quality control in a bevel edge removing system. Measuring an edge region of a substrate being processed can be performed simultaneously as bevel edge removal, thus shortening inspection time. Misprocessing of a system, for example bevel edge too wide or too thin, may be detected immediately, thus minimizing damage. Contaminations and incomplete removal may be detected while the substrate is still in the chamber, providing opportunities to fix problems in-situ. Further, eccentricity of the substrate and/or bevel edge region can be measured, thus, providing means to calibrate the fluid dispensing nozzles, centering assemblies, and transferring robots.

Although, the above discussion is focused on processing a semiconductor substrate, the present invention may also be used in processing various substrates, such as a glass substrate for a liquid crystal display, a plasma display panel, or a ceramic substrate for magnetic discs.

While the foregoing is directed to embodiments of the present invention, other and further embodiments of the invention may be devised without departing from the basic scope thereof, and the scope thereof is determined by the claims that follow.

The invention claimed is:

1. A method for inspecting a substrate, comprising:
   providing a rotatable substrate support member;
   providing a sensor pivotably positioned above the substrate support member, wherein the sensor comprises an optical assembly configured to project an optical beam;
   positioning the substrate on the substrate support member; and
   inspecting a front side of the substrate in a spiral motion by pivoting the sensor while rotating the substrate, wherein the inspecting the front side of the substrate comprises:
      projecting an optical beam onto the front side of the substrate using the optical assembly of the sensor, wherein projecting the optical beam comprises projecting a beam spot on the front side of the substrate, and at least one of a rotating rate, pivoting rate, and size of the beam spot is adjusted such that along a given radius, neighboring beam spots overlap one another; and
      measuring a reflected optical beam from the front side of the substrate.

2. The method of claim 1, wherein the inspecting the front side of the substrate further comprises determining characteristics of the substrate from measurement of the reflected optical beam.

3. The method of claim 1, wherein overlapping ratio is about 30%.

4. The method of claim 1, wherein the pivoting is performed such that the sensor moves radially outwardly and or inwardly in a constant speed.

5. The method of claim 1, further comprising calculating width of a bevel edge along a periphery of the substrate.

6. The method of claim 1, further comprising:
   providing a chemical nozzle configured to dispensing a processing fluid to the front side to the substrate, wherein the sensor is mounted on a side of the chemical nozzle; and
   processing the substrate while inspecting simultaneously.

7. A method for cleaning a substrate, comprising:
   positioning a substrate on a substrate support;
   rotating the substrate support along with the substrate about a central axis of the substrate support; and
   cleaning the substrate by moving a nozzle and a sensor relative to the substrate to simultaneously dispense a processing fluid on to the substrate and inspect the substrate, wherein the sensor comprises an optical assembly configured to project a signal beam, and moving the nozzle and sensor comprises:
      moving the chemical arm radially outward relative to the substrate, wherein the sensor and the nozzle are mounted on a distal end of the chemical arm;
      projecting a signal beam through the optical assembly of the sensor to a pinpoint spot to allow the signal beam to reflect towards the sensor, wherein projecting the signal beam comprises:
         projecting a beam spot to the substrate; and
         adjusting at least one of a rotating rate, speed of the chemical arm, and size of the beam spot such that neighboring pinpoint spots along a given radius overlap one another; and
      measuring an intensity of the reflected signal beam.

8. The method of claim 7, wherein moving the nozzle and sensor further comprises:
dispensing the processing fluid to a focus point on the substrate,
wherein the focus point is radially outside the pinpoint spot.

9. The method of claim 7, wherein projecting the signal beam comprises collimating and focusing an electromagnetic radiation from a light emission source to the pinpoint spot.

10. The method of claim 7, wherein moving the chemical arm comprises moving the chemical arm at a constant speed relative to the central axis.

11. A method for cleaning a substrate, comprising:
positioning a substrate on a substrate support;
rotating the substrate support along with the substrate about a central axis of the substrate support;
cleaning the substrate by moving a nozzle and a sensor relative to the substrate to simultaneously dispense a processing fluid on to the substrate and inspect the substrate, wherein the sensor comprises an optical assembly configured to project a signal beam, moving the nozzle and sensor comprises moving a chemical arm radially outward relative to the substrate, and the sensor and the nozzle are mounted on a distal end of the chemical arm; and
measuring an eccentricity of an edge bevel region of the substrate relative to the central axis of the substrate support, wherein the bevel edge region is an outer edge region of the substrate where a layer of material has been removed.

12. The method of claim 11, wherein measuring the eccentricity comprises:
projecting a signal beam through an optical assembly of the sensor to a plurality of pinpoint spots along a circumference of the substrate at a first distance away from the central axis;
measuring an intensity of the reflected signal beam from each of the plurality of the pinpoint spots; and
averaging intensity measurements of from the plurality of the pinpoint spots for the first distance.

13. The method of claim 12, wherein measuring the eccentricity further comprises:
repeating projecting, measuring and averaging for a plurality of distances; and
detecting a peak in a curve indicating the average intensity along the plurality of distances.

14. The method of claim 7, further comprising:
moving the sensor along a radius of the rotating substrate while projecting the signal beam towards the substrate; and
measuring an average intensity of the reflected signal beam along the radius, wherein a peak in a curve of the average intensity along the radius indicates eccentricity of the bevel edge region.

15. The method of claim 14, wherein measuring the average intensity comprises:
projecting the signal beam to a plurality of spots along a circumference of the substrate at a distance away from the central axis;
measuring an intensity of the reflected signal beam from each of the plurality of the spots;
averaging intensity measurements of from the plurality of the spots for the distance; and
repeating projecting, measuring and averaging for a plurality of distances.

* * * * *